United States Patent
Matsui et al.

(10) Patent No.: US 6,518,932 B1
(45) Date of Patent: Feb. 11, 2003

(54) RADIO COMMUNICATION DEVICE

(75) Inventors: Toshiaki Matsui, Koganei (JP); Atsushi Yamada, Tenri (JP)

(73) Assignees: Communications Research Laboratory, Independent Administrative Institute, Tokyo (JP); Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/913,461
(22) PCT Filed: Feb. 15, 2000
(86) PCT No.: PCT/JP00/00824
§ 371 (c)(1), (2), (4) Date: Aug. 15, 2001
(87) PCT Pub. No.: WO00/48269
PCT Pub. Date: Aug. 17, 2000

(30) Foreign Application Priority Data

Feb. 15, 1999 (JP) .......................... 11-035268

(51) Int. Cl.[7] .................... H01Q 1/38; H01Q 13/10
(52) U.S. Cl. ................ 343/770; 343/767; 343/700 MS
(58) Field of Search .................... 343/770, 700 MS, 343/872, 767, 702, 753, 910, 911 R; H01Q 1/38, 13/10

(56) References Cited

U.S. PATENT DOCUMENTS

| 4,371,877 | A | | 2/1983 | Doussot et al. |
| 4,755,820 | A | * | 7/1988 | Backhouse et al. .. 343/700 MS |
| 6,008,771 | A | * | 12/1999 | Tanaka et al. ............ 343/767 |
| 6,366,245 | B1 | * | 4/2002 | Schmidt et al. ...... 343/700 MS |

FOREIGN PATENT DOCUMENTS

| EP | 743697 | 11/1996 |
| JP | 7235826 | 9/1995 |
| JP | 9289414 | 11/1997 |
| JP | 10079623 | 3/1998 |

OTHER PUBLICATIONS

H. Yamada et al., "A high efficient dielectric lens antenna for millimeter–wave band placed above the vertical radiating plane of NRD circuit," C–172 of General Meeting in '96 of The Institute of Electronics, Information and Communication Engineers.

Hitoshi Utagawa et al., "Millimeter–wave CPW Mixer integrated with Multi–Slot Antenna," C–2–52 of General Meeting in '98 of The Institute of Electronics, Information and Communication Engineers.

G.P. Gauthier, et al.: IEEE Trans. On Microwave Theory and Techniques, vol. 43, No. 7, 1995, pp. 1669–1672.

S.S. Gearhart et al.: IEEE Trans. on Microwave Theory and Techniques, vol. 42, No. 12, Dec. 1994, pp. 2504–2511.

* cited by examiner

*Primary Examiner*—Hoanganh Le
(74) *Attorney, Agent, or Firm*—Birch, Stewart, Kolasch, & Birch, LLP

(57) ABSTRACT

A combination antenna and radio communication device comprises a dielectric base (10) on which a multislot antenna (101) made of conductor, a coplanar transmission line (102), a power supply line, and a high-frequency unit (104) are provided. A conductive package (105) and the dielectric base (103) hermetically seal the high-frequency unit (104), the coplanar transmission line (102), and the multislot antenna (101). The lower face of the dielectric base (103) faces to a conductive sheet (107) having an opening (106) for passing therethrough electromagnetic waves. Electromagnetic waves are passed through the dielectric base (103) and taken out through the opening (106). Therefore the combination antenna and radio device for pseudo-millimeteric and millimeteric waves have a small size, high performance and excellent massproductivity.

24 Claims, 12 Drawing Sheets

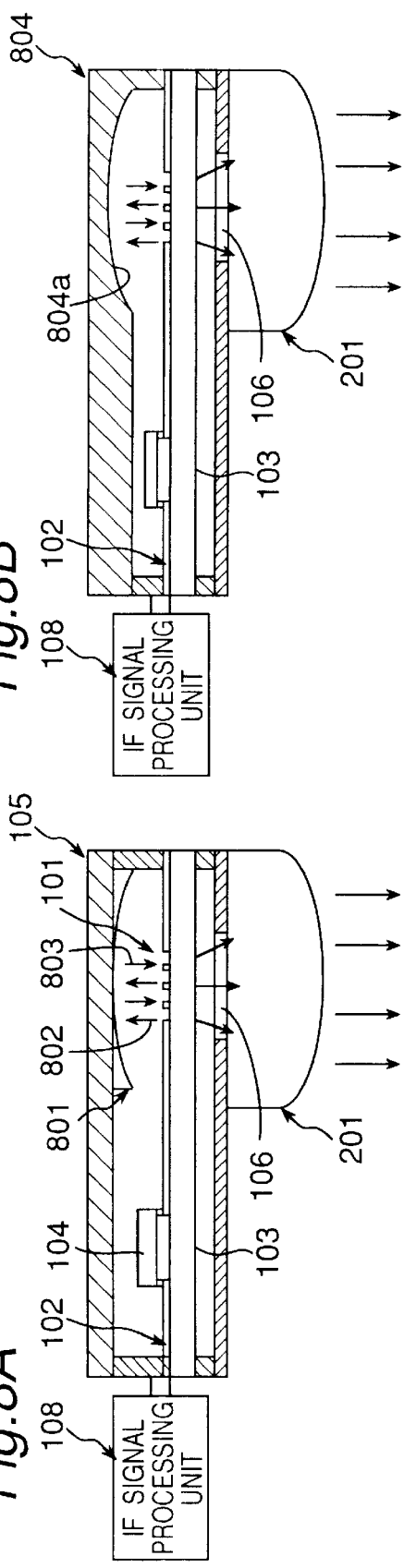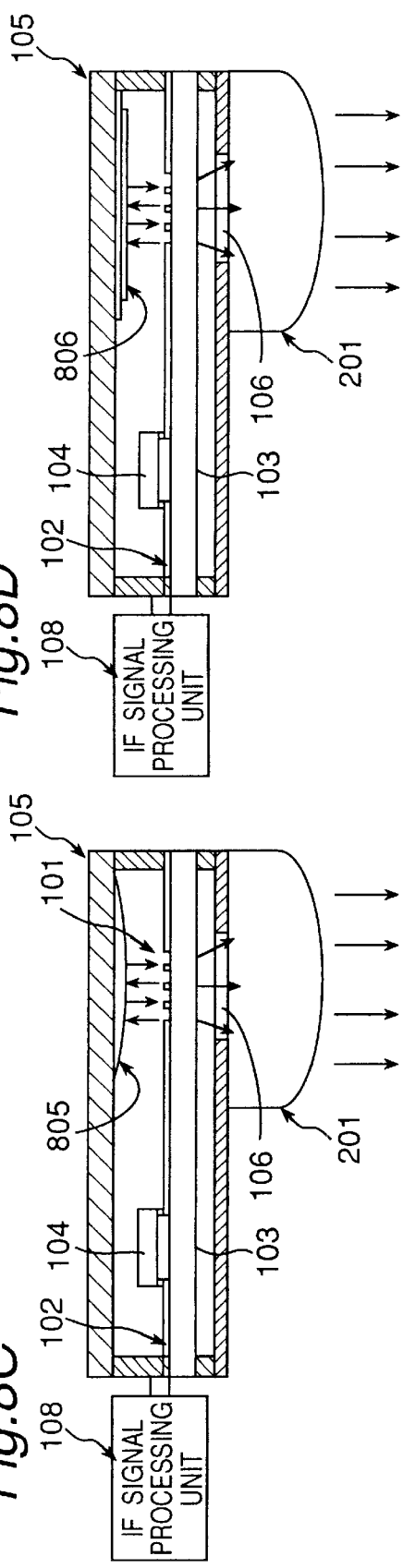

Fig.18
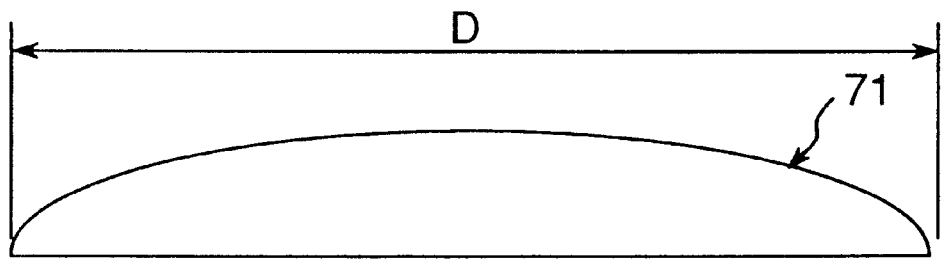
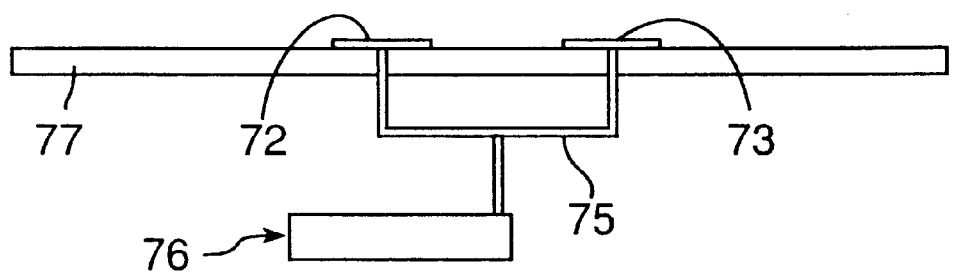
Fig.19
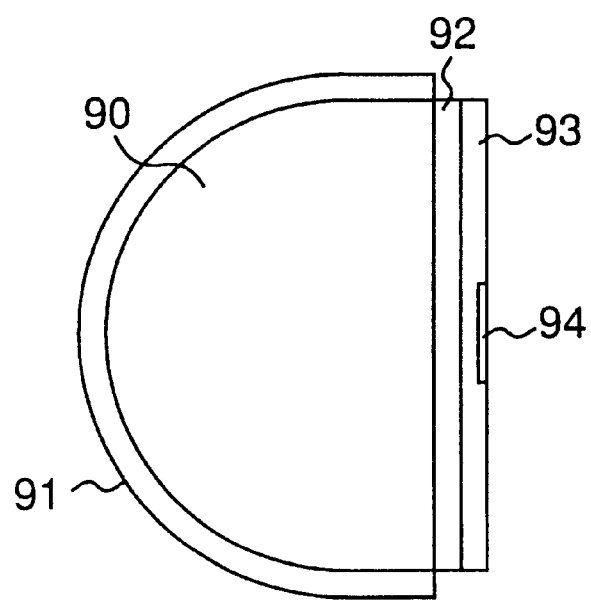

RADIO COMMUNICATION DEVICE

This application is the national phase under 35 U.S.C. §371 of PCT International Application No. PCT/JP00/00824 which has an International filing date of Feb. 15, 2000, which designated the United States of America and was not published in English.

TECHNICAL FIELD

The present invention relates to radio communication devices for pseudo-millimetric and millimetric wavebands and to a compact radio communication device in which an antenna and a high-frequency unit are integrated with each other.

BACKGROUND ART

Conventionally, in a frequency region below the microwave band, a radio communication device has been used by independently designing and manufacturing a high-frequency unit formed of a frequency converter circuit, a local oscillator circuit, an amplifier circuit and so on and an antenna and connecting them by means of a connector or mounting them on an identical substrate. However, in the pseudo-millimetric and millimetric waveband regions of higher frequencies, losses in a power supply line and connecting portions between the high-frequency unit and the antenna rapidly increase, and this has been a serious problem in providing a practicable efficient device.

In order to solve this problem, there is needed a structural technology in which the antenna and the high-frequency unit are integrated with each other for the frequencies higher than the pseudo-millimetric and millimetric wavebands. The antenna element and the antenna have the same meaning.

As a concrete measure against these problems, Japanese Patent Laid-Open Publication No. HEI 10-79623 discloses one example of a radio communication device in which an antenna and a high-frequency unit are housed in an identical package.

According to Japanese Patent Laid-Open Publication No. HEI 10-79623, a substrate on the identical surface of which the antenna element and the high-frequency unit are formed and a package conductor for hermetically sealing the antenna element and the high-frequency unit formed on the substrate in a common space are provided, and a partial region that belongs to the package conductor and faces the antenna element is nonconductive.

In another example shown in FIG. 7 of Japanese Patent Laid-Open Publication No. HEI 10-79623, a conductive shield plate for preventing electromagnetic mutual interferences is provided between a high-frequency unit and an antenna element.

An example of a combination of an NRD (nonradiative dielectric) wave guide (nonradiative dielectric line), a dielectric resonator and a dielectric lens is disclosed in C-172 of General Meeting in 1996 of The Institute of Electronics, Information and Communication Engineers. Radiation is made in the vertical direction from the NRD circuit surface by converting the LSM01 mode that is the propagation mode of the NRD guide into the HE11 mode of the dielectric resonator and further making excitation of a slot on the resonator, and a beam is formed by means of the dielectric lens. By virtue of the use of a dielectric resonator of a high Q value and an NRD guide of a very little transmission loss, the losses between the high-frequency unit and the antenna can be restrained. The system that employs the NRD guide is often used in the communication system for the millimetric waveband.

An example in which a multislot antenna and a frequency converter unit are integrated with each other is disclosed in C-2-52 of General Meeting in 1998 of The Institute of Electronics, Information and Communication Engineers. According to this, a multislot antenna and a coplanar transmission line connected to the multislot antenna are formed in a pattern on a dielectric substrate, and a frequency converter circuit is formed at the other terminal of the coplanar transmission line. An RF signal received by the multislot antenna passes through the coplanar transmission line so as to be inputted to the frequency converter circuit, while a local oscillation signal is inputted from an LO terminal. The RF signal is mixed with the local oscillation signal in the frequency converter circuit so as to be frequency converted and outputted as an IF signal from an IF terminal.

The multislot antenna is suitable for millimetric waveband communications characteristic of a wide band property for the reasons that matching can easily be achieved by adjusting the number of slots and that a wide bandwidth can be provided in comparison with the patch antenna and the like.

The radio communication device for the frequency region below the microwave band has conventionally been used by independently designing and manufacturing a high-frequency unit formed of a frequency converter circuit, a local oscillator circuit, an amplifier circuit and so on and an antenna and connecting them by means of a connector or mounting them on an identical substrate.

However, in the pseudo-millimetric and millimetric waveband regions of higher frequencies, a loss in the power supply line between the high-frequency unit and the antenna rapidly increases, and therefore, it has been an important problem to integrate the high-frequency circuit section and the antenna in providing a practical high-efficiency radio communication device.

By virtue of the development in the high-frequency semiconductor device technologies, devices for microwave to millimetric wavebands can lately be provided in the form of an integrated circuit (MMIC (monolithic microwave integrated circuit)). For the microwave band, a variety of flat antenna technologies are developed and array antenna technologies coping with the increase in antenna gain practically needed have been achieved. In contrast to this, in the pseudo-millimetric and millimetric wavebands of higher frequencies, it is difficult to provide a high-efficiency high-gain antenna by the method of using an array antenna similar to that of the microwave band due to the losses rapidly increasing in the power supply line and the connecting portions with the increase in frequency.

In order to popularize the millimetric waveband technologies, it has been required to develop a new antenna technology of a small size and light weight capable of reducing the cost by mass production.

On the other hand, in the far-infrared and submillimetric wavebands of wavelengths shorter than that of the millimetric wave, a quasi-optical technology with a dielectric lens antenna, which is a receiver technologies for scientific researches of radio astronomy and so on, has been put into practical use as an optical method.

An example of the use of a combination of a thin film detection element constructed based on the geometrical-optical design method and a lens is described in "A Monolithic 250 GHz Schottky-Diode Receiver" IEEE TRANS- ACTIONS ON THEORY AND TECHNIQUES, VOL. 42, NO. 12, DECEMBER 1994" As shown in FIG. 19, this receiver unit, in which an antenna and a high-frequency detection element are integrated with each other, is constructed of a high-resistance silicon lens 90, a polyethylene matching cap 91, a silicon substrate 92, and a receiver 94 formed on a gallium arsenide substrate 93. Normally, according to the design based on optical technologies, both the diameter of the lens and the distance between the lens and the light-concentrating surface need ten or more wavelengths, and therefore, the diameter of an extended hemisphere lens amounts to about eleven wavelengths of the wavelengths in the air in the example of the aforementioned technical report. Furthermore, a distance from the center of the hemisphere to the substrate is extended with the lens material, providing an antenna with a basically three-dimensional structure. When the aforementioned quasi-optical lens technology is used, at the millimetric wave of a frequency of 100 GHz or less, which is expected to be put into practical use in the near future, the lens has a large actual size and a heavy weight and is not suitable for mass production, resulting in a high-cost large structure. Moreover, a parabola antenna with a reflecting mirror, which is generalized in the radio astronomy, the satellite communication terrestrial station and the like, similarly becomes a device of a three-dimensional mechanical structure and is not regarded as a technology to be widely popularized in the future. An antenna device technology of a quite new concept has been strongly demanded in order to provide a high-performance low-cost millimetric wave radio communication device.

DISCLOSURE OF THE INVENTION

The technology disclosed in the prior art of Japanese Patent Laid-Open Publication No. HEI 10-79623 has the following problems (1) through (4).

(1) It is required to provide the package for hermetic sealing with a nonconductive electromagnetic wave window, and therefore, a special device is needed for hermetic sealing, leading to high cost.

(2) The antenna substrate and the semiconductive substrate are arranged on the conductive substrate. Therefore, it is required to connect the antenna with the semiconductive substrate by means of a metallic wire or a metallic ribbon, and the loss in the connected point is large.

(3) As a method for obtaining a high antenna gain, it is required to increase the effective opening by arranging a plurality of antenna elements in an array form. In this case, package size becomes large. Therefore, an unnecessary electromagnetic wave mode is generated by the effect of the inside of the package functioning as a waveguide, and this possibly exerts bad influence on the operation of the antenna and the high-frequency unit.

(4) When a conductive shield plate is provided between the antenna and the high-frequency unit, the radiated wave of the antenna is partially reflected on the shield plate to make an asymmetrical antenna pattern, and this leads to the problems that an unnecessary side lobe is generated to reduce the antenna efficiency.

Moreover, according to the technology with the NRD guide disclosed in C-172 of General Meeting in 1996 of The Institute of Electronics, Information and Communication Engineers, the NRD guide itself has excellent low-loss transmission path characteristic, whereas its has drawbacks in the structure as a three-dimensional circuit in addition to a limitation in device miniaturization and poor mass productivity.

According to the technology disclosed in C-2-52 of General Meeting in 1998 of The Institute of Electronics, Information and Communication Engineers, the multislot antenna and the frequency converter circuit are not electromagnetically separated and disadvantageously interfere with each other, and no concrete measure for securing a stable operation is taken.

Accordingly, in view of the aforementioned conventional problems, it is an object of the present invention to provide a radio communication device constructed of a semiconductor module that has excellent mass productivity and has a built-in antenna element suitable for millimetric and pseudo-millimetric waves.

Another object of the present invention is to provide a new radio communication device technology capable of further reducing the cost by mass production by integrating a high-frequency unit with an antenna based on a flat-surface integrated circuit technology with high performance, a small size and light weight in order to achieve the effective use of the pseudo-millimetric and millimetric wavebands.

In order to achieve the above object, there is provided an antenna-integrated type radio communication device connected to an intermediate frequency signal processing unit, wherein a high-frequency unit arranged on a dielectric base on an upper surface of which a multislot antenna made of a conductor, a coplanar transmission line and a power supply line are formed, the high-frequency unit being coupled with the multislot antenna by means of the coplanar transmission line, the communication device being hermetically sealed by a conductor package and the dielectric base, and a conductive sheet having an opening for passage of an electromagnetic wave is attached to a lower surface of the dielectric base.

With this arrangement, the mass productivity can be secured by the improvement of the hermetic sealing method.

In one embodiment of the present invention, a distance between the conductor package and the dielectric base is one-fourth of a wavelength of the electromagnetic wave.

Reflected waves from the conductor package are combined with one another with a phase difference of one wavelength, and a high gain is provided with a unidirectional arrangement.

In one embodiment of the present invention, an electromagnetic shield plate is provided on both sides of the multislot antenna located on the dielectric base, and a cut is formed on the electromagnetic shield plate in a portion arranged on the coplanar transmission line.

The leakage of the radio wave radiated from the antenna to the high-frequency unit side is reduced.

In one embodiment of the present invention, a dielectric lens having a converging effect is provided outside the opening for the passage of the electromagnetic wave.

By virtue of the effect of convergence, a radio wave can be radiated in the specifically limited direction of angle or a radio wave from the specifically limited direction of angle can be received, allowing the communication distance to be extended.

In one embodiment of the present invention, the dielectric lens having a converging effect is zoned so as to be thin.

The communication distance is extended, and the reduction in the thickness and weight of the antenna-integrated type radio communication device can be concurrently achieved.

In one embodiment of the present invention, a dielectric waveguide section is arranged between the dielectric base and the dielectric lens.

With this arrangement, the effect of convergence can be further increased.

In one embodiment of the present invention, a dielectric waveguide section is arranged between the dielectric base and the conductor package on an upper surface side of the dielectric base.

With this arrangement, the leakage preventing effect and the effect of convergence can be further increased.

In one embodiment of the present invention, a reflecting mirror having a converging effect is arranged between the dielectric base and the conductor package on an upper surface side of the dielectric base.

With this arrangement, the leakage preventing effect and the effect of convergence can be further increased.

Also, there is provided a radio communication device for a pseudo-millimetric or millimetric waveband, wherein
   an antenna section of the radio communication device is comprised of an electromagnetic wave radiation structure connected to a transmitter-receiver circuit section or a transmitter circuit section or a receiver circuit section and a dielectric body,
   the dielectric body is arranged adjacent to the electromagnetic wave radiation structure and has a structure that is thick in a center region and thin in a peripheral portion, and a thickness of the center region of the dielectric body is approximately $(1/2) \times m$ (m: integer) of an effective wavelength of a desired electromagnetic wave in the dielectric body.

With this arrangement, as a consequence of the interference of the multi-reflected waves between two surfaces of the dielectric body, the reflected wave of the electromagnetic wave entering the dielectric body is weakened and concurrently a transmitted wave is strengthened. By virtue of the effect of the dielectric body arranged adjacent and the spreading of an electromagnetic field due to the repetitive reflection of the electromagnetic waves combined in the dielectric body, the wave is re-radiated (or received by being coupled with an electromagnetic wave radiation structure) as an electromagnetic wave source of an expanded effective opening, and the antenna gain is increased.

Also, there is provided a radio communication device for a pseudo-millimetric or millimetric waveband, wherein
   an antenna section of the radio communication device is comprised of an electromagnetic wave radiation structure connected to a transmitter-receiver circuit section or a transmitter circuit section or a receiver circuit section and a dielectric body,
   the dielectric body is arranged adjacent to the electromagnetic wave radiation structure and is a parallel-flat-plate-shaped convergence medium that has a high permittivity in a center region and a low permittivity in a peripheral region, and a thickness of the center region of the dielectric body is approximately $(1/2) \times m$ (m: integer) of an effective wavelength of a desired electromagnetic wave in the dielectric body.

With this arrangement, as a consequence of the interference of the multi-reflected waves between two surfaces of the dielectric body, the reflected wave of the electromagnetic wave entering the dielectric body is weakened and concurrently a transmitted wave is strengthened. By virtue of the effect of the dielectric body arranged adjacent and the spreading of an electromagnetic field due to the repetitive reflection of the electromagnetic waves combined in the dielectric body, the wave is re-radiated (or received by being coupled with an electromagnetic wave radiation structure) as an electromagnetic wave source of an expanded effective opening, and the antenna gain is increased.

In one embodiment of the present invention, m of approximately $(1/2) \times m$ is not greater than four.

With this arrangement, the electromagnetic wave can be stored more efficiently in the dielectric body, and the antenna gain can be increased.

In one embodiment of the present invention, a diameter of the dielectric body at an opening toward a space is set within a range of about one to six times the wavelength of the desired electromagnetic wave in the air.

With this arrangement, the electromagnetic wave can be stored much more efficiently in the dielectric body, and the antenna gain can be increased.

In one embodiment of the present invention, a plurality of electromagnetic wave radiation structures joined to an electromagnetic waveguide connected to the transmitter-receiver or the transmitter circuit section or the receiver circuit section are arranged on an identical surface, and the diameter of the dielectric body at an opening toward the space is within a range of four to twenty times the wavelength of the desired electromagnetic wave in the air.

With this arrangement, a higher antenna gain can be obtained.

In one embodiment of the present invention, a distance between the dielectric body and the electromagnetic wave radiation structure is approximately $(1/2) \times n$ (n: integer) of the wavelength of the desired electromagnetic wave in the air.

With this arrangement, the electromagnetic wave can be stored more efficiently in the dielectric body, and the antenna gain can be increased.

In one embodiment of the present invention, n of $(1/2) \times n$ of the wavelength is not greater than four.

With this arrangement, the electromagnetic wave can be stored more efficiently in the dielectric body, and the antenna gain can be increased.

In one embodiment of the present invention, the electromagnetic wave radiation structure is any one of a slot antenna structure, a multislot antenna structure, a conductor patch structure, a planar spiral antenna structure and a bowtie antenna structure.

In one embodiment of the present invention, the electromagnetic waveguide is any one of a microstrip transmission line, a coplanar type transmission line (CPW), a coplanar type transmission line (GCPW) backed with a conductive sheet, a slot type waveguide, an image waveguide, a non-radiative dielectric line, a coaxial line and a metallic waveguide.

BRIEF DESCRIPTION OF THE DRAWINGS

FIG. 8A is a sectional view of an antenna-integrated type radio communication device according to an eighth embodiment of the present invention; FIG. 8B is a sectional view of a modification example of the eighth embodiment; FIG. 8C is a sectional view of another modification example of the eighth embodiment; FIG. 8D is a sectional view of yet another modification example of the eighth embodiment;

FIG. 18 is a sectional view of a radio communication device according to a twelfth embodiment of the present invention;

FIG. 19 is a sectional view of a conventional radio communication device;

BEST MODE FOR CARRYING OUT THE INVENTION

FIRST EMBODIMENT

Figure 1B:
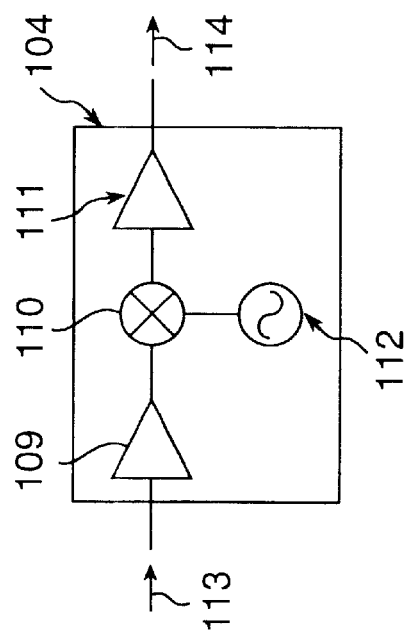
FIG. 1B is a block diagram showing the construction of an MMIC 104 that is the high-frequency unit of the first embodiment.
Figure 1A:
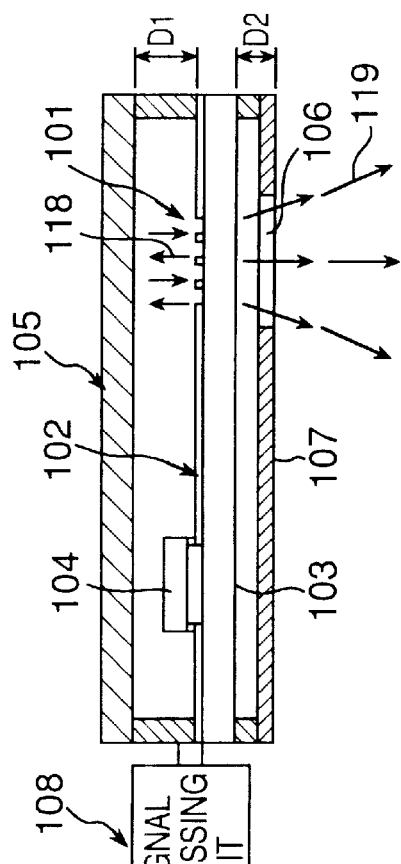
FIG. 1A is a sectional view of an antenna-integrated type radio communication device according to a first embodiment of the present invention.

FIG. 1A is a sectional view of a radio communication device according to the first embodiment of the present invention.

An MMIC 104 that constitutes a high-frequency unit is flip-chip connected onto a dielectric base 103 on which a multislot antenna 101 and a coplanar transmission line 102 are formed in a pattern. An upper surface of the base 103 on which the MMIC 104, the multislot antenna 101 and the coplanar transmission line 102 are formed in a pattern is hermetically sealed by a conductor package 105 that concurrently serves as an electromagnetic wave reflector. A distance D1 between the dielectric base 103 and the conductor package 105 is one-fourth of the wavelength of the desired electromagnetic wave.

A lower portion of the base 103 is covered with a conductive sheet 107 that has an electromagnetic wave passage opening 106. This conductive sheet 107 plays the role of a shield, but the sheet is not required to hermetically seal inside. The reference numeral 108 denotes an intermediate frequency (IF) signal processing unit.

The principle of operation of a transmitter of the above construction will be described next. First, FIG. 1B shows a block diagram of one structural example of the MMIC 104 that operates as a high-frequency unit. This MMIC 104 is constructed of an intermediate frequency (IF) signal amplifier 109, a frequency converter 110, a radio frequency (RF) signal amplifier 111 and a local signal generating unit 112. Although FIG. 1B shows the example in which these functions are integrated into one chip, the functions can also be distributed into several chips.

An IF signal 113 generated by the IF signal processing unit 108 is inputted to the MMIC 104, amplified by the IF signal amplifier 109 in the MMIC 104, mixed with a local signal from the local signal generator 112 in the frequency converter 110, converted into an RF signal and amplified by the RF signal amplifier 111. An RF signal 114 outputted from the MMIC 104 is inputted to the multislot antenna 101 and radiated upwardly and downwardly. The upwardly radiated electromagnetic wave 118 is reflected on the conductor package 105, superimposed on an output radiation electromagnetic wave 119 radiated from a lower portion of the base 103 and then radiated. In this case, the conductor package 105 located in the upper portion of the dielectric base 103 that concurrently serves as the reflector is not required to be specifically devised, and the conventional hermetic sealing technology for microwave element and the conventional package material can be used without modification. Moreover, the conductive sheet 107 located under the dielectric base 103 plays the role of a shield for electromagnetic waves, but the sheet is not required to hermetically seal inside.

Although the example of the transmitter that converts the IF signal 113 into the RF signal 114 and radiates the signal is described here, it is allowed to constitute a receiver that receives an RF signal and converts the signal into an IF signal by modifying the structure of the MMIC without modifying any structure of the other portions.

Figure 1C:
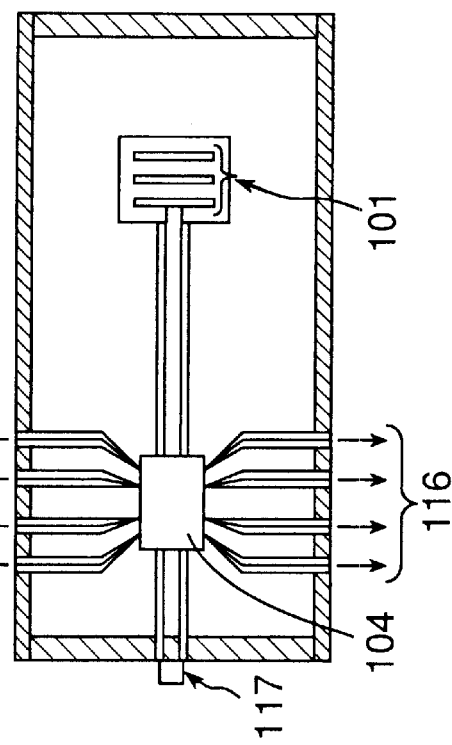
FIG. 1C is a plan view of a dielectric base of the first embodiment.

FIG. 1C shows a plan view of the dielectric base on which the multislot antenna 101 and the coplanar transmission line shown in FIG. 1A are formed in a pattern. The reference numerals 115 and 116 denote wiring lines for applying a direct current (DC) bias to the MMIC 104, while 117 denotes an IF input terminal.

In this first embodiment, the high-frequency unit 104, the antenna 101 and the coplanar transmission line 102, which are arranged on the dielectric base 103, are hermetically sealed by a package 105 having no passage opening for electromagnetic wave and the dielectric base 103. The electromagnetic wave is taken out of the electromagnetic wave passage opening 106 provided for the conductive sheet 107 attached to the opposite side of the base 103 through the dielectric base 103. This arrangement enables the provision of a compact antenna-integrated type communication device that has excellent mass productivity for pseudo-millimetric wave and millimetric wave transmission.

SECOND EMBODIMENT

Figure 2:
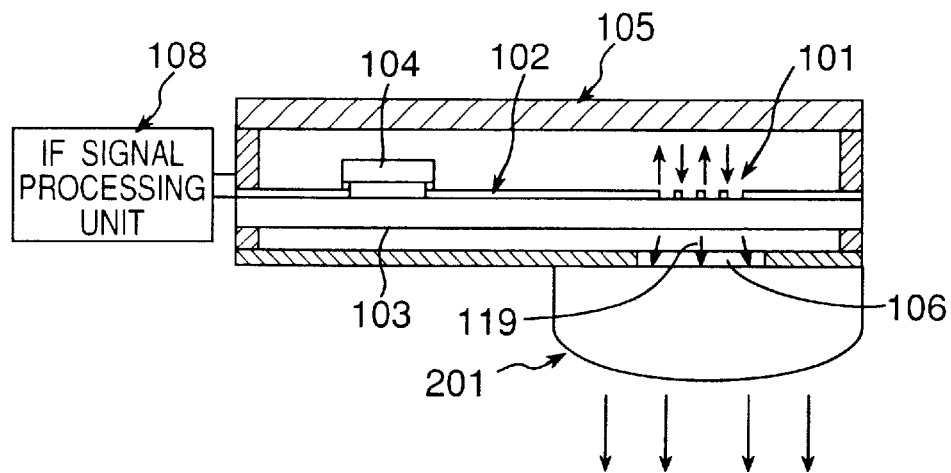
FIG. 2 is a sectional view of an antenna-integrated type radio communication device according to a second embodiment of the present invention.

FIG. 2 is a sectional view of a radio communication device according to the second embodiment of the present invention.

The different point from the first embodiment is only that a convex lens 201 is provided outside the passage opening 106 for electromagnetic wave, and the other constructions are same as those of the first embodiment. An electromagnetic wave 119 radiated by the same operational principle as in the first embodiment is refracted and converged by the convex lens 201, and therefore, the antenna gain is increased. The diameter of this convex lens 201 is set about five times the effective wavelength of the desired wave. Moreover, by optimizing the radius of curvature of the convex lens 201, the desired antenna gain can be obtained. This. convex lens 201 is manufactured by mechanically cutting or forming by means of a metallic mold the material of polymethyl methacrylate, styrene acrylonitrile, polycarbonate, polystyrene, epoxy, polymethylpentene, polytetrafluoroethylene, polyethylene, Teflon or the like besides quartz and glass. Although FIG. 2 shows a plano-convex lens as a lens that has an effect of convergence, the lens can also be replaced by a double-convex lens. By setting the thickness in the vicinity of the center of this convex lens 201 to about the integral multiple of one-half of the intra-lens effective wavelength, the reflection of the electromagnetic wave at the interface between the lens and the air can be reduced.

It is to be noted that the convex lens 201 is employed here as an equivalent of the convex-lens-shaped dielectric body. Moreover, the diameter of the convex lens 201 is set about five times the effective wavelength of the desired wave. About five times the effective wavelength becomes about one wavelength to four wavelengths in terms of the wavelength in the air, depending on the permittivity of the convex lens.

Moreover, in the present embodiment, the multislot antenna 101 is employed as the electromagnetic wave radiation structure, and the coplanar line 102 is employed as an electromagnetic waveguide. However, these members are not limited to the above-mentioned ones, and the effect of the arrangement that the dielectric body and the electromagnetic wave radiation structure are placed adjacent to each other does not change even if other structures are employed.

THIRD EMBODIMENT

Figure 3:
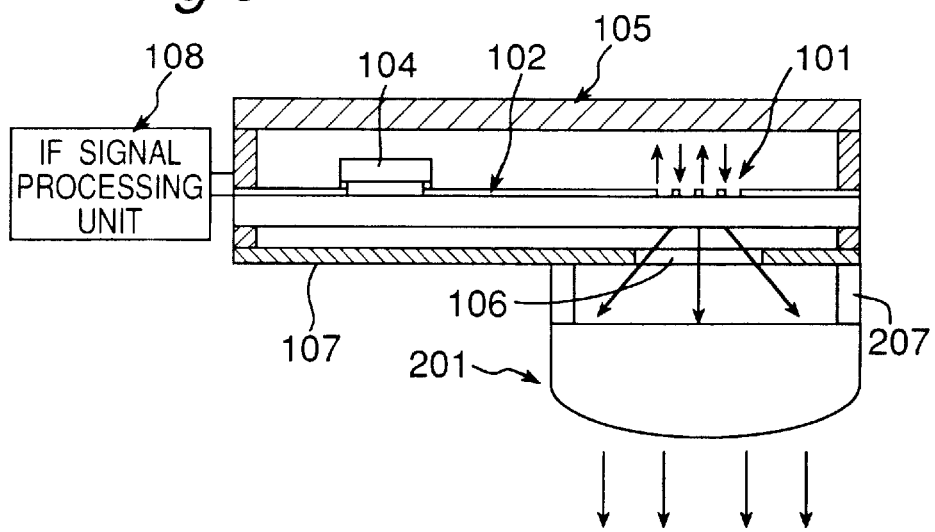
FIG. 3 is a sectional view of an antenna-integrated type radio communication device according to a third embodiment of the present invention.

FIG. 3 is a sectional view of a radio communication device according to the third embodiment of the present invention.

This third embodiment differs from the second embodiment only in that the convex lens 201 is separated from the passage opening 106 for electromagnetic wave.

That is, by interposing a spacer 207 between the convex lens 201 and the conductive sheet 107, the desired antenna gain can be obtained by adjusting the distance between the multislot antenna 101 and the center of the lens for optimization, although the distance is within the focal distance of the lens.

FOURTH EMBODIMENT

Figure 4:
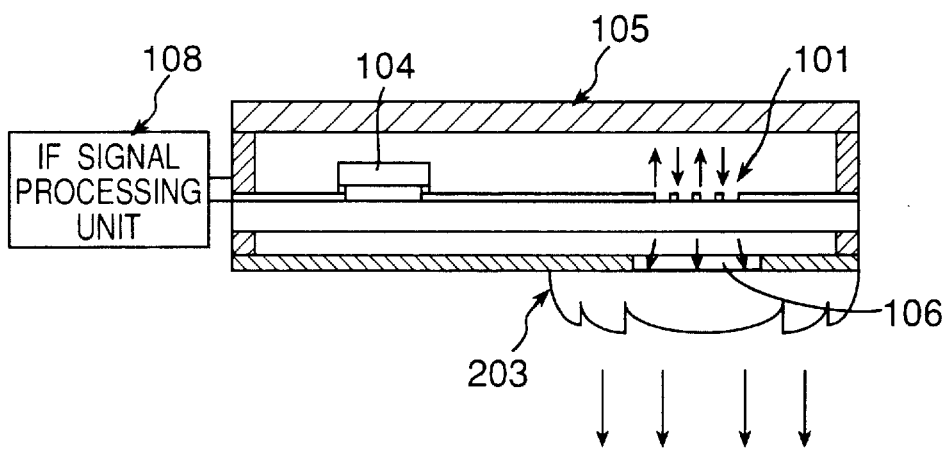
FIG. 4 is a sectional view of an antenna-integrated type radio communication device according to a fourth embodiment of the present invention.

FIG. 4 is a sectional view of a radio communication device according to the fourth embodiment of the present invention.

This fourth embodiment differs from the second embodiment in that a lens 203 obtained by zoning the plano-convex lens 201 is used. By the use of this zoned lens 203, the volume of the lens can be reduced without impairing the effect of refraction of the electromagnetic wave, and this allows the radio communication device to have a small size and a light weight.

FIFTH EMBODIMENT

Figure 5A:
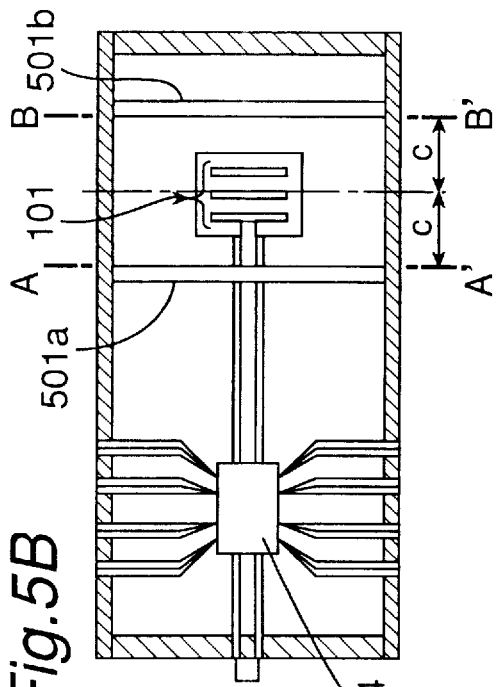
FIG. 5A is a sectional view of an antenna-integrated type radio communication device according to a fifth embodiment of the present invention.

FIG. 5A is a sectional view of a radio communication device according to the fifth embodiment of the present invention.

This fifth embodiment differs from the second embodiment in that shield plates 501a and 501b are placed on both sides of the multislot antenna 101 between the dielectric base 103 and the package 105.

Figure 5B:
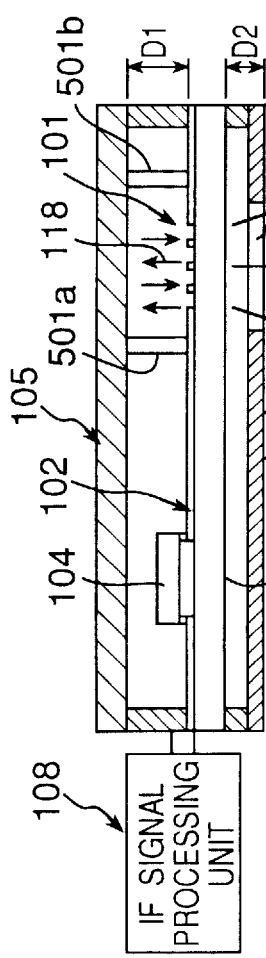
FIG. 5B is a plan view of a dielectric base of the fifth embodiment.
Figure 5C:
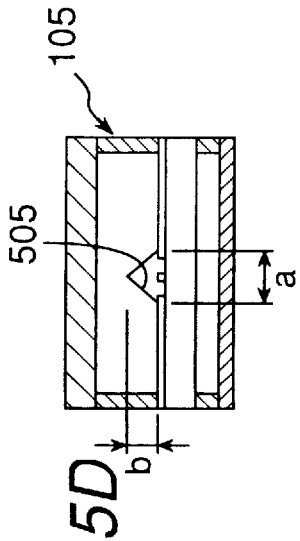
FIG. 5C is a sectional view taken along the line A–A' of the dielectric base of the fifth embodiment.

FIG. 5B shows its plan view. FIG. 5C shows a cross section (A–A') of FIG. 5B. In order to transmit an RF signal in the quasi-TEM mode and cut off an RF signal in the waveguide mode, a cut 502 is formed on the shield plate 501a above the coplanar transmission line 102 that connects the MMIC 104 with the multislot antenna 101. By setting the lengths a and b of the cut 502 shown in FIG. 5C to one-half or less of the wavelength of the desired electromagnetic wave, the unnecessary waveguide mode can be cut off, and this enables the removal of mutual influence exerted between the multislot antenna 101 and the high-frequency unit 104. Moreover, as shown in FIG. 5B, when a distance c from the shield plate 501a and the shield plate 501b to the center of the multislot antenna 101 is set to one-fourth of the wavelength of the desired electromagnetic wave, the unnecessary reflection is cancelled and the antenna efficiency is maximized.

According to this fifth embodiment, by attaching the shield plates 501a and 501b to the multislot antenna 101, the distance of communications can be increased and the signal transmission error can be reduced, enabling the practical use of the pseudo-millimetric wave and millimetric wave transmission.

Figure 5E:
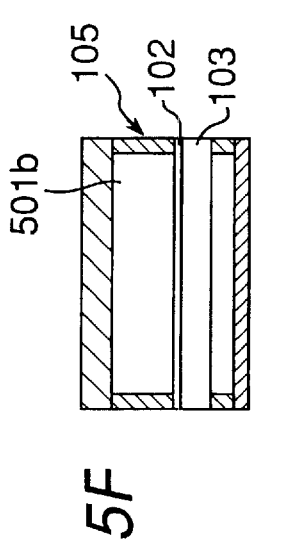
FIG. 5E is another modification example of the fifth embodiment.
Figure 5D:
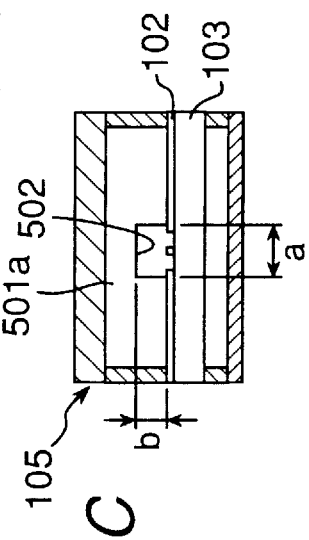
FIG. 5D is a modification example of the fifth embodiment.
Figure 5F:
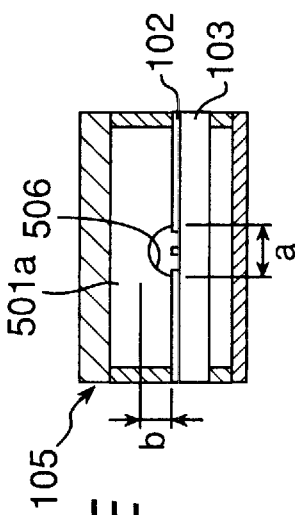
FIG. 5F is a sectional view taken along the line B–B' in FIG. 5B.

Although the cut 502 of the shield plate 501a has a rectangular form, it is acceptable to adopt a triangular cut 505 and a semicircular cut 506 as shown in FIGS. 5D and 5E. FIG. 5F is a view of a cross section (B–B') of FIG. 5B.

SIXTH EMBODIMENT

Figure 6:
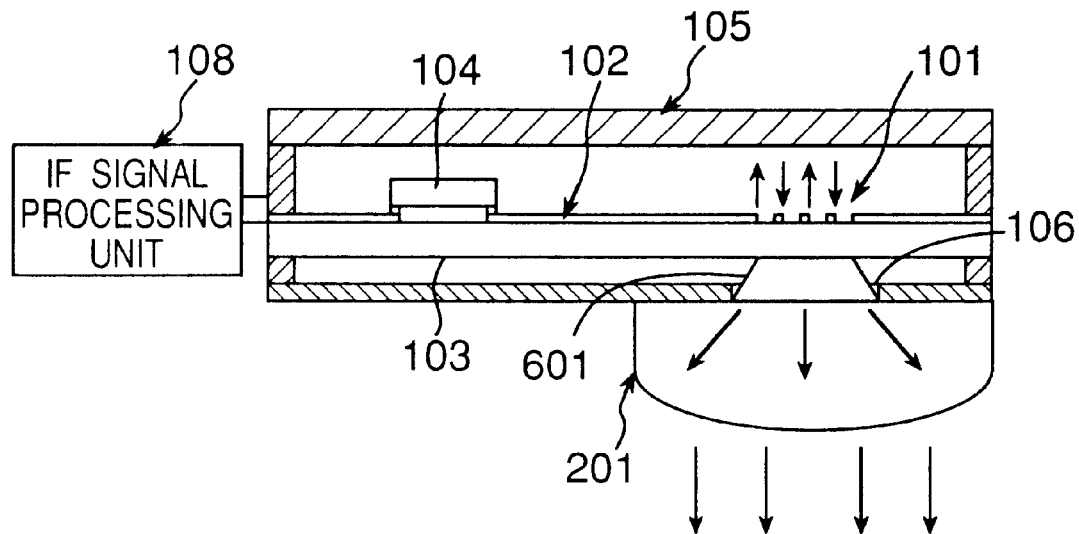
FIG. 6 is a sectional view of an antenna-integrated type radio communication device according to a sixth embodiment of the present invention.

FIG. 6 is a sectional view of a radio communication device according to the sixth embodiment of the present invention.

This sixth embodiment differs from the second embodiment only in that the convex lens 201 and the dielectric base 103 are connected with each other by means of a dielectric waveguide section 601.

In this sixth embodiment, an electromagnetic wave radiated from the multislot antenna 101 is guided to the convex lens 201 by the dielectric waveguide section 601. Moreover, since no air layer exists between the convex lens 201 and the multislot antenna 101 due to the dielectric waveguide section 601, and therefore, the unnecessary reflection on the convex lens 201 and the multislot antenna 101 can be restrained.

Similarly to the convex lens 201, the dielectric waveguide section 601 is manufactured by mechanically cutting or forming by means of a metallic mold the material of polymethyl methacrylate, styrene acrylonitrile, polycarbonate, polystyrene, epoxy, polymethylpentene, polytetrafluoroethylene, polyethylene, Teflon or the like besides quartz and glass. Although the materials of the convex lens 201 and the dielectric waveguide section 601 are not necessarily be the same. However, it is also desirable that their permittivities are close to each other. It is also possible to manufacture the convex lens 201 and the dielectric waveguide section 601 by concurrently molding them with an identical material by means of a metallic mold.

SEVENTH EMBODIMENT

Figure 7:
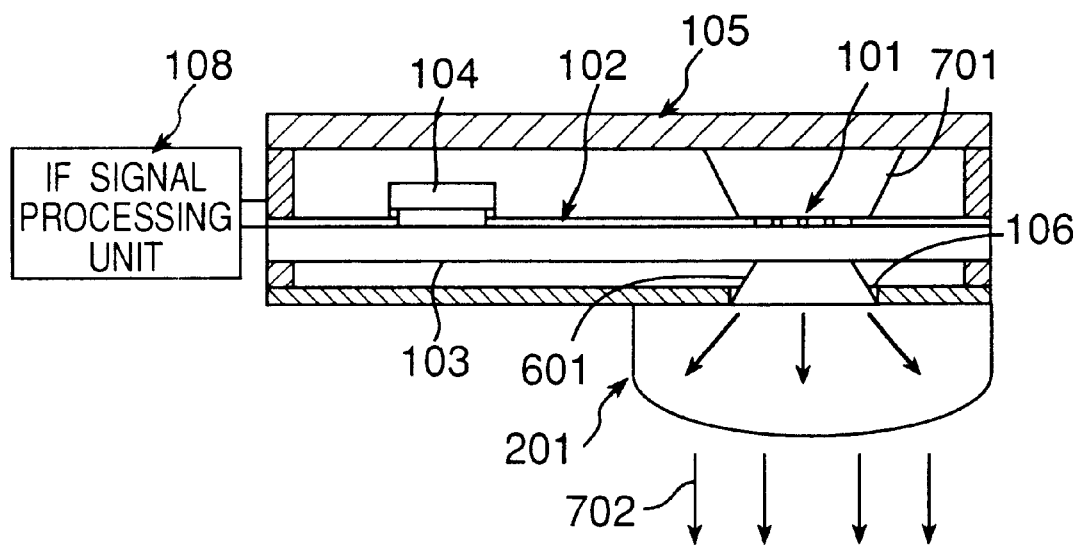
FIG. 7 is a sectional view of an antenna-integrated type radio communication device according to a seventh embodiment of the present invention.

FIG. 7 is a sectional view of a radio communication device according to the seventh embodiment of the present invention.

This seventh embodiment differs from the sixth embodiment in that a dielectric waveguide section 701 is placed between the upper surface of the dielectric base 103 and the package 105 and that the distance between the upper portion of the dielectric base 103 and the upper portion of the package 105 is set to one-fourth of the effective wavelength of the electric wave in the dielectric waveguide section 701.

The beam width of the electromagnetic wave radiated upwardly of the multislot antenna 101 is narrowed by the dielectric waveguide section 701 and reflected, and an electric wave 702 is further radiated into the space via the dielectric waveguide section 701 and the convex lens 201. The dielectric waveguide section 701 operates as a guide of the radiated wave from the multislot antenna 101, also producing the effect of preventing the unnecessary transmission of electromagnetic waves in the package.

Similarly to the convex lens 201 and the dielectric waveguide section 601, this dielectric waveguide section 701 is manufactured by mechanically cutting or forming by means of a metallic mold the material of polymethyl methacrylate, styrene acrylonitrile, polycarbonate, polystyrene, epoxy, polymethylpentene, polytetrafluoroethylene, polyethylene, Teflon or the like besides quartz and glass.

EIGHTH EMBODIMENT

FIG. 8A is a sectional view of a radio communication device according to the eighth embodiment of the present invention.

This eighth embodiment differs from the second embodiment only in that a reflecting mirror 801 having an converging effect is provided inside the conductor package 105 above the dielectric base 103. The provided reflecting mirror 801 that has the converging effect plays the role of reflecting an electromagnetic wave 802 radiated upwardly of the multislot antenna 101 as a reflected wave 803 by is narrowing the width of the radiated wave toward the multislot antenna side and preventing the electromagnetic wave from being transmitted in unnecessary directions inside the conductor package 105, as compared with the case where the reflecting mirror 801 having the converging effect is not provided.

The reflecting mirror 801 having the converging effect is formed of a material of aluminum, gold, copper or the like. It is also acceptable to concurrently manufacture the reflecting mirror 801 having the converging effect and the conductor package 105.

FIG. 8B shows another example of the reflecting mirror that has the converging effect, provided by a package 804 having a concave mirror 804a which is partially made concave. This example has the same effect as that of the embodiment described with reference to FIG. 8A. FIG. 8C shows another example of the reflecting mirror having an equivalent converging effect, provided by a convex dielectric body 805. This example also has the same effect as that of the embodiment described with reference to FIG. 8A. FIG. 8D shows an example in which a function equal to that of the convex dielectric body 805 in FIG. 8C is equivalently provided by a plurality of circular dielectric plates 806 of different diameters, and this example has the same effect as that of the example described with reference to FIG. 8A.

NINTH EMBODIMENT

Figure 9:
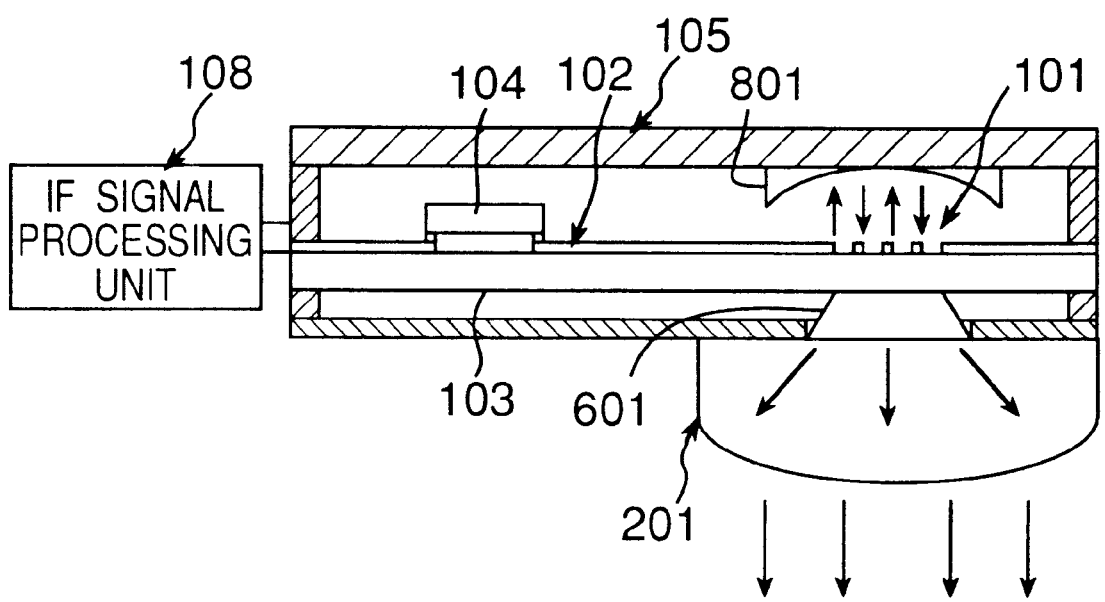
FIG. 9 is a sectional view of an antenna-integrated type radio communication device according to a ninth embodiment of the present invention.

FIG. 9 is a sectional view of a radio communication device according to the ninth embodiment of the present invention.

This ninth embodiment differs from the eighth embodiment only in that a plano-convex lens 201 and the dielectric base 103 are connected by means of a dielectric waveguide section 601. The role of the dielectric waveguide section 601 is the same as that described in connection with the sixth embodiment, and therefore, no description is repeated here.

TENTH EMBODIMENT

Figure 10:
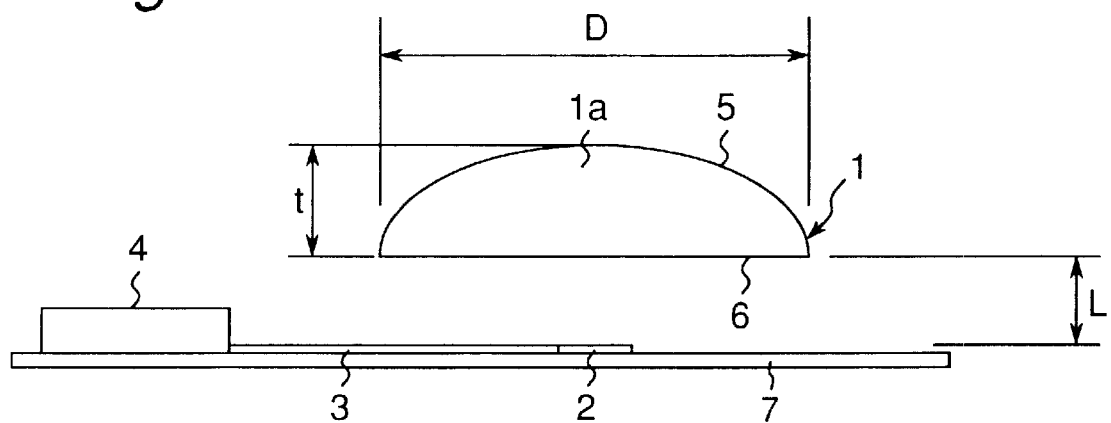
FIG. 10 is a sectional view of a tenth embodiment of the present invention.

FIG. 10 is a sectional view of a radio communication device according to the tenth embodiment of the present invention.

This tenth embodiment is constructed of a dielectric body 1, an electromagnetic wave radiation structure 2, an electromagnetic waveguide 3, a high-frequency unit 4 and a dielectric base 7. In this case, the high-frequency unit 4 is a generic high-frequency unit constructed of an amplifier, a frequency converter unit, a filter and so on.

The dielectric body 1 has a shape that is thick at the center and thin in the peripheral portion and is arranged adjacent to the electromagnetic wave radiation structure 2 while being separated apart by a distance L. Moreover, a thickness t of a center portion 1a of the dielectric body 1 was set to about 0.5 wavelength of the wavelength of the specified electromagnetic wave in the dielectric body 1. It is to be noted that the thickness t of this center portion 1a may be set to any one of about 1.0 wavelength, about 1.5 wavelengths and about two wavelengths of the wavelength of the specified electromagnetic wave in the dielectric body 1.

An electromagnetic waveguide 3 is connected to the high-frequency unit 4, and this electromagnetic waveguide 3 is connected to the electromagnetic wave radiation structure 2. The dielectric body 1 is arranged opposite to this electromagnetic wave radiation structure 2. This dielectric body 1 has a flat bottom surface 6 that faces the electromagnetic wave radiation structure 2 and has a convex surface 5 that faces the space. With regard to this dielectric body 1, its bottom surface 6 is located apart by a distance L from the electromagnetic wave radiation structure 2, as described above.

In this tenth embodiment, the electromagnetic wave radiated from the electromagnetic wave radiation structure 2 is partially reflected on the convex surface 5 and the bottom surface 6 of the dielectric body 1 and travels toward the electromagnetic wave radiation structure 2. However, there is a passageway difference of one wavelength between the two waves reflected on the convex surface 5 and the bottom surface 6, and the electromagnetic wave reflected on the bottom surface 6 has an inverted phase at the time of reflection, and therefore, a phase difference between the two waves becomes 180°, as a consequence of which the waves weaken each other.

Therefore, a component incident on the dielectric body 1 arranged adjacently out of the electromagnetic waves radiated from the electromagnetic wave radiation structure 2 is repetitively reflected on the bottom surface 6 and the convex surface 5 of the dielectric body 1 and resonates since the thickness of the dielectric body 1 is the integral multiple of approximately 0.5 wavelength, as a consequence of which the transmitted wave of the electromagnetic wave incident on the dielectric body 1 is intensified and the reflected wave is weakened in contrast to this. The distribution of the electromagnetic field expands inside the dielectric body 1 by the repetitive reflection in the dielectric body 1, and this operates as an antenna having an expanded actual opening, results in increasing the antenna gain.

Furthermore, when the diameter D of the convex surface 5 of the dielectric body 1 serving as an opening toward the space is set within a range of about one to six times the wavelength of the desired electromagnetic wave in terms of the wavelength in the air, the greater part of the electromagnetic wave energy radiated from the electromagnetic wave radiation structure 2 is efficiently taken into the dielectric body 1. The electromagnetic wave energy accumulated in this dielectric body 1 is radiated as a re-radiated wave from the dielectric body 1 into the space, and therefore, the antenna gain is increased.

Furthermore, when the distance between the dielectric body 1 and the electromagnetic wave radiation source 2 is set to any one of about 0.5 wavelength, about 1.0 wavelength, about 1.5 wavelengths and about two wavelengths in terms of the wavelength in the air, the electromagnetic wave resonates between the bottom surface 6 and the electromagnetic wave radiation structure 2 and is more efficiently taken into the dielectric body 1. Therefore, the antenna gain can be increased.

Figure 11:
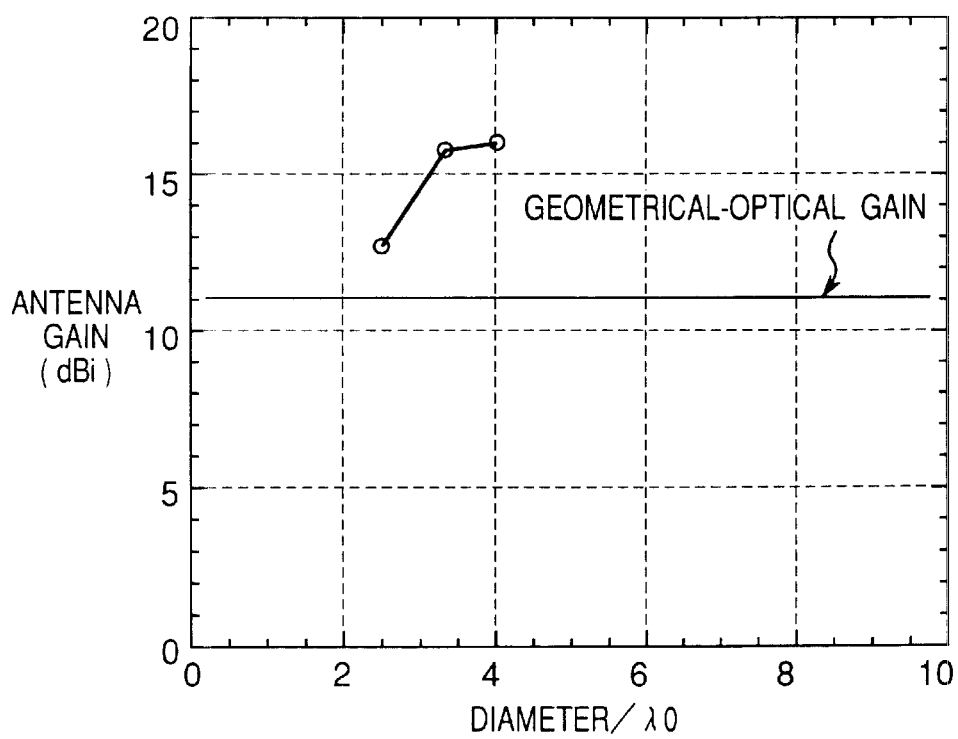
FIG. 11 is a characteristic graph showing a relation of an antenna gain to (diameter D of a dielectric body 1/wavelength $\lambda_0$ of an electromagnetic wave in the air)

In this case, in order to confirm the effect of the increase in the antenna gain according to the tenth embodiment of the present invention, the antenna gain was measured with a plano-convex-shaped dielectric body 1 of a relative permittivity of 3.8 arranged adjacent to the multislot 2 that was a sort of the electromagnetic wave radiation structure. FIG. 11 shows the measurement result of this antenna gain. In FIG. 11, the vertical axis represents the antenna gain (dBi), and the horizontal axis represents the multiple of the diameter D of the convex surface 5 of the dielectric body 1 serving as the opening toward the space devided by a wavelength $\lambda_0$ of the electromagnetic wave of 25 GHz in the air.

According to this measurement, the thickness t of the center portion 1a of the dielectric body 1 is selected so as to become about two wavelengths in terms of effective wavelength in the dielectric body 1, so that the transmissivity is maximized with the reflection on the dielectric body 1 restrained. Moreover, in FIG. 11, the antenna gain obtained by calculation with the formula of the geometrical-optical lens under assumption that the dielectric body 1 is a virtual geometrical-optical lens expediently is indicated for comparison by the solid line. As shown in FIG. 11, the diameter D of the dielectric body 1 through this measurement is 2.5 wavelengths to four wavelengths in terms of wavelength in the air, and the value is much smaller than the dimensional condition of ten wavelengths or more on the precondition of the geometrical-optical design. Moreover, a distance L between the electromagnetic wave radiation structure (multislot) 2 and the dielectric body 1 is about the wavelength in the air, and this means a very adjacent arrangement, significantly apart from the geometrical-optical condition.

According to the construction of this tenth embodiment, it was experimentally confirmed that the electromagnetic wave energy from the electromagnetic wave radiation structure 2 expanded in the dielectric body 1 and a gain higher than the antenna gain obtained substantially by the geometrical-optical design was obtained, producing a great effect in increasing the antenna gain. According to this experiment, the diameter D of the dielectric body 1 is selected to 2.5 wavelengths to four wavelengths with respect to the wavelength of the specified electromagnetic wave in the air. However, a similar antenna gain increasing effect is also produced when the diameter D of the dielectric body 1 is selected to about one to six wavelengths of the aforementioned wavelength.

Figure 12:
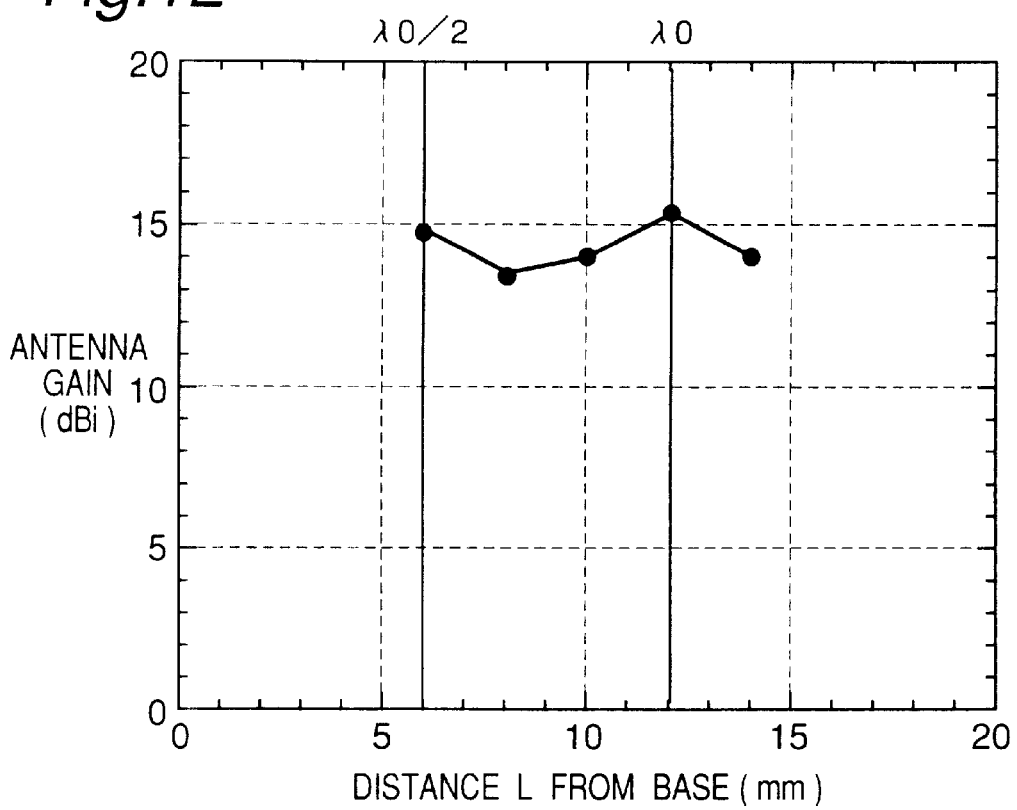
FIG. 12 is a characteristic graph showing a relation of a distance between the dielectric body and an electromagnetic wave radiation structure to the antenna gain.

Next, FIG. 12 shows a relation of the distance L between the dielectric body 1 and the electromagnetic wave radiation structure 2 to the antenna gain when the diameter D of the convex surface 5 of the dielectric body 1 serving as the opening toward the space is set 2.5 times the wavelength of the desired electromagnetic wave in the air. As shown in FIG. 12, the antenna gain exhibits a peak when this distance L is 0.5 wavelength and one wavelength with respect to the wavelength $\lambda_0$ in the air. Also, this measurement result is significantly different from the result presumed by the geometrical-optical design. That is, it could be confirmed that the antenna gain was increased when the distance L was set to the wavelength $\lambda_0/2$ or the wavelength $\lambda_0$ because the desired electromagnetic wave was more efficiently taken into the dielectric body 1 by the resonance between the dielectric body 1 and the electromagnetic wave radiation structure 2, according to these measurement results. A substantially similar effect increasing the antenna gain is produced when the distance L between the dielectric body 1 and the electromagnetic wave radiation structure 2 is set to about 1.5 wavelength ($1.5\lambda_0$) or two wavelengths ($2\lambda_0$).

The aforementioned experimental results indicate that the present invention is obviously different from the operation of the conventional geometrical-optical lens. The increase in gain by virtue of the combination with the dielectric body corresponds to the diameter D of the lens-shaped dielectric body 1. This can be understood for the reasons that the greater part of the electromagnetic wave energy radiated from the electromagnetic wave radiation structure 2 is taken into the dielectric body 1 by the proximity effect of the dielectric body 1 arranged adjacent to the electromagnetic wave radiation structure 2 located apart by the distance L and further the effective high gain is achieved by re-radiation with the minute-size plano-convex-shaped dielectric body 1 used as a wave source. The experimental results indicate that the reflected waves between the surface 6 of the dielectric body 1 and the electromagnetic wave radiation structure 2 are effectively combined again and efficiently radiated into the space when the interval L is close to the integral multiple of the one-half wavelength.

Although the transmitter is taken as an embodiment here, the operations of the dielectric body 1 and the electromagnetic wave radiation structure 2 produce the reversible effect for the achievement of the same antenna gain in a receiver. By changing the construction of the high-frequency unit 4, a receiver can also be constructed.

Figure 13A:
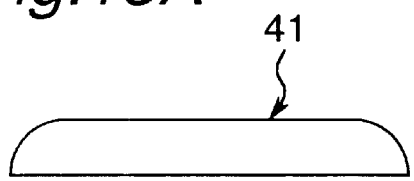
FIG. 13A is a view of a modification of the dielectric body 1 of the tenth embodiment.
Figure 13B:
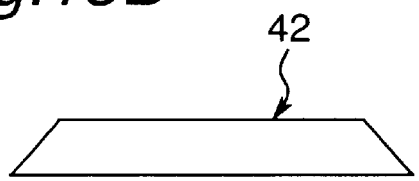
FIG. 13B is a view of another modification of the dielectric body 1.
Figure 13C:
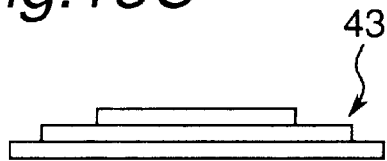
FIG. 13C is a view of yet another modification of the dielectric body 1.

Moreover, the dielectric body 1 is not limited to the plano-convex-shape and, as shown in FIG. 13A, a dielectric body 41 whose surface on the radiation space side is constructed of a flat surface and a peripheral curved surface may be provided. Furthermore, a trapezoidal dielectric body 42 may be provided as shown in FIG. 13B, or a dielectric body 43 of a structure in which a plurality of disks whose diameters are reduced in order are stacked may be provided as shown in FIG. 13C.

Figure 14A:
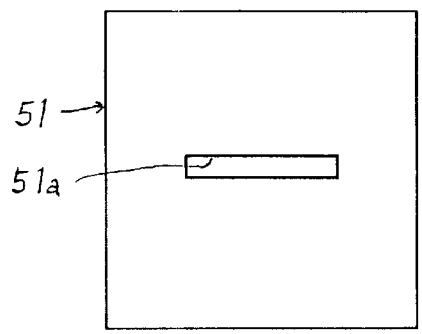
FIG. 14A is a view showing a slot antenna structure according to one example of the electromagnetic wave radiation structure 2 of the tenth embodiment.
Figure 14B:
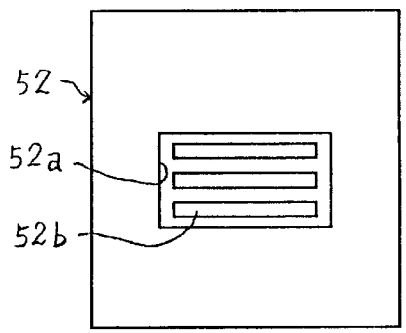
FIG. 14B is a view showing a multislot antenna structure as one example of the electromagnetic wave radiation structure 2.
Figure 14C:
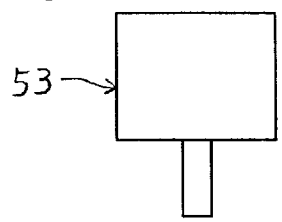
FIG. 14C is a view showing a conductor patch structure as one example of the electromagnetic wave radiation structure 2.
Figure 14D:
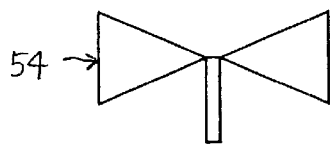
FIG. 14D is a view showing a bowtie antenna structure as one example of the electromagnetic wave radiation structure 2.

Moreover, the electromagnetic wave radiation structure 2 is not limited to any specified structure. A slot antenna structure 51 having a slot 51a may be provided as shown in FIG. 14A, or a multislot antenna structure 52 in which a plurality of strip segments 52b are arranged in an opening section 52a may be provided as shown in FIG. 14B. Furthermore, a conductor patch structure 53 may be provided as shown in FIG. 14C, or a bowtie antenna structure 54 may be provided as shown in FIG. 14D. Furthermore, a planar spiral or a waveguide slot having a flange structure or the like can be employed.

The periphery of an identical surface of the conductor patch structure shown in FIG. 14C as an example of the electromagnetic wave radiation structure 2 may be a conductor surface separated from the central side by a gap without conductor. Likewise, the periphery of an identical surface of the bowtie antenna structure shown in FIG. 14D as an example of electromagnetic wave structure 2 may be a conductor surface separated from the central side by a gap without conductor.

Figure 15A:
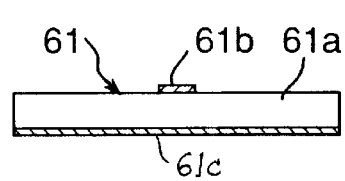
FIG. 15A is a view showing a microstrip transmission line as one example of an electromagnetic waveguide 3 of the tenth embodiment.
Figure 15B:
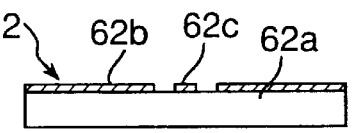
FIG. 15B is a view showing a coplanar type transmission line (CPW) as one example of the electromagnetic waveguide 3.
Figure 15C:
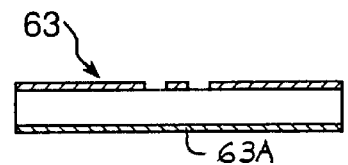
FIG. 15C is a view showing a coplanar type transmission line (GCPW) backed with a conductive sheet as one example of the electromagnetic waveguide 3.
Figure 15D:
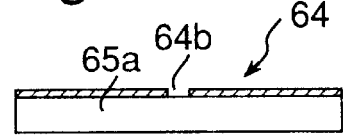
FIG. 15D is a view showing a slot type waveguide as one example of the electromagnetic waveguide 3.
Figure 15E:
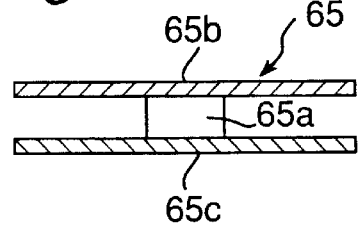
FIG. 15E is a view showing an NRD dielectric waveguide as one example of the electromagnetic waveguide 3.
Figure 15F:
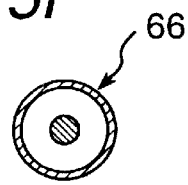
FIG. 15F is a view showing a coaxial line as one example of the electromagnetic waveguide 3.
Figure 15G:
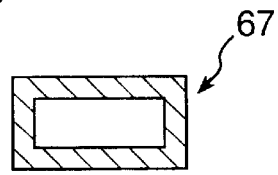
FIG. 15G is a view showing a metallic waveguide as one example of the electromagnetic waveguide 3.

Furthermore, the electromagnetic waveguide 3 is not limited to any specified structure. As shown in FIG. 15A, a microstrip transmission line 61 composed of a dielectric body 61a sandwitched in conductors 61b and 61c may be provided, or as shown in FIG. 15B, a coplanar type transmission line (CPW) 62 where a conductor 62b is formed on a dielectric body 62a and a stripe-shaped conductor 62c is formed in the opening section of this conductor 62b may be provided. Furthermore, a coplanar type transmission line (GCPW) 63 backed with a conductive sheet 63A may be provided as shown in FIG. 15C. Furthermore, a slot type waveguide 64 where a slot 64b is formed on a dielectric body 64a may be provided as shown in FIG. 15D, or an NRD dielectric waveguide 65 comprised of a dielectric body 65a sandwitched in conductors 65b and 65c may be provided as shown in FIG. 15E. A coaxial line 66 may be provided as shown in FIG. 15F, or a metallic waveguide 67 or the like can be provided as shown in FIG. 15G. In short, any one that is properly connected to the electromagnetic wave radiation structure shown by way of examples in FIGS. 14A through 14D can be employed.

ELEVENTH EMBODIMENT

Figure 16:
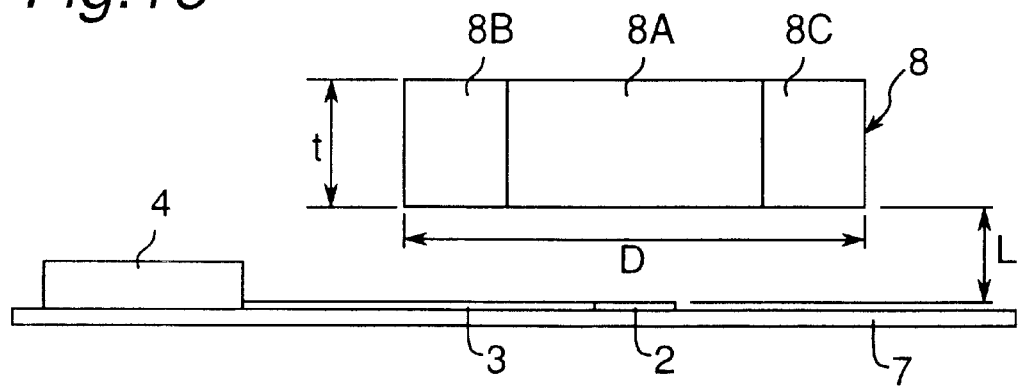
FIG. 16 is a sectional view of a radio communication device according to an eleventh embodiment of the present invention.

FIG. 16 is a sectional view of a radio communication device according to the eleventh embodiment of the present invention.

This eleventh embodiment differs from the tenth embodiment only in that a dielectric body 8 made of a parallel-flat-plate-shaped convergence medium as shown in FIG. 16 is provided in place of the dielectric body 1 of the tenth embodiment.

Figure 17A:
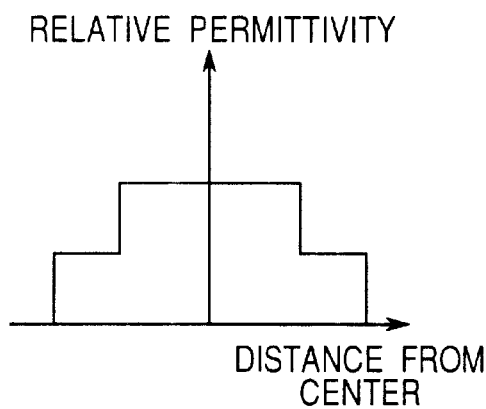
FIG. 17A is a characteristic graph showing one example of the distribution of the relative permittivity of a dielectric body 8 of the eleventh embodiment.
Figure 17B:
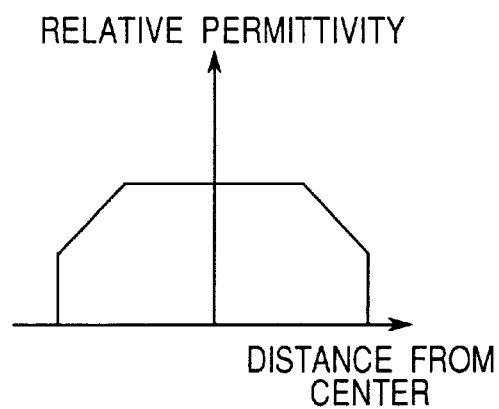
FIG. 17B is a characteristic graph showing another example of the distribution of the relative permittivity of the dielectric body 8.
Figure 17C:
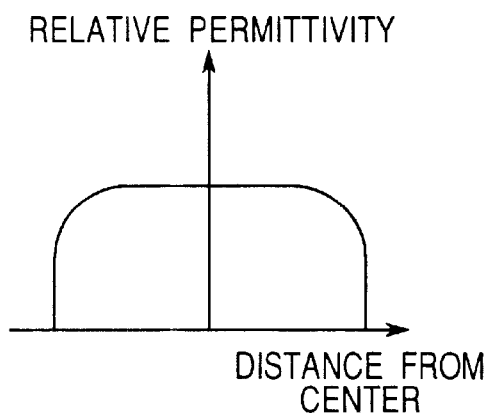
FIG. 17C is a characteristic graph showing yet another example of the distribution of the relative permittivity of the dielectric body 8.
Figure 17D:
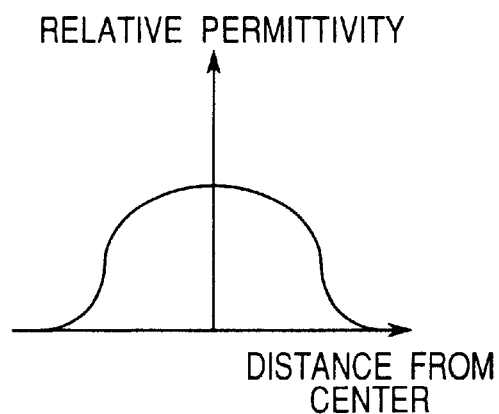
FIG. 17D is a characteristic graph showing still another example of the distribution of the relative permittivity of the dielectric body 8.

This dielectric body 8 is the parallel-flat-plate-shaped convergence medium in which the permittivity is high in a center region 8A and low in peripheral portions 8B and 8C. The thickness in the center region 8A of the dielectric body 8 is any one of about 0.5 wavelength, about one wavelength, about 1.5 wavelengths and about two wavelengths of the effective wavelength of the desired electromagnetic wave in the dielectric body 8. This dielectric body 8 is substantially equivalent to the dielectric body 1 of the tenth embodiment, and an effect similar to that of the tenth embodiment can be obtained. This eleventh embodiment differs from the tenth embodiment only in the structure of the dielectric body 8. The other factors of the diameter D of the dielectric body 8, the distance L between the dielectric body 8 and the electromagnetic wave radiation structure 2, the type of the electromagnetic wave radiation structure 2, the type of the electromagnetic waveguide 3 and so on are the same as described in connection with the tenth embodiment, and therefore, no description is repeated here. The relative permittivity of the dielectric body 8 is only required to have a distribution in which it is high in the center portion 8A and low in the peripheral portions 8B and 8C. For example, the distribution of the relative permittivity of this dielectric body 8 may be a stepped distribution as shown in FIG. 17A or a rectangular distribution with a chamfered corners as shown in FIG. 17B. Furthermore, there may be provided a rectangular distribution with a curved corners as shown in FIG. 17C or a distribution of a temple-bell-like shape with spread skirts as shown in FIG. 17D.

TWELFTH EMBODIMENT

FIG. 18 is a sectional view of a radio communication device according to the twelfth embodiment of the present invention.

This twelfth embodiment differs from the tenth embodiment or the eleventh embodiment in that the electromagnetic wave radiation structure is arranged in an array form of two or more elements and the diameter D of a dielectric body 71 is made four to twenty times the wavelength of the desired electromagnetic wave in the air.

Electromagnetic wave radiation structures 72 and 73 formed on the dielectric base 77 are each connected to a dielectric waveguide 75 and connected to a high-frequency unit 76 so as to be combined at the other end quite similarly to the power supply waveguide of the conventional array antenna. When the electromagnetic wave radiation structures 72 and 73 are arranged in the array form of two or more elements and the dielectric body 71 whose diameter D is four to twenty times the wavelength of the desired electromagnetic wave in the air, a very high antenna gain of 30 dBi or the like is obtained. Although FIG. 18 shows the example of the array of two elements, there is the effect of increasing the antenna gain even with an electromagnetic wave radiation structure constructed of an array of a greater number of elements.

Figure 21:
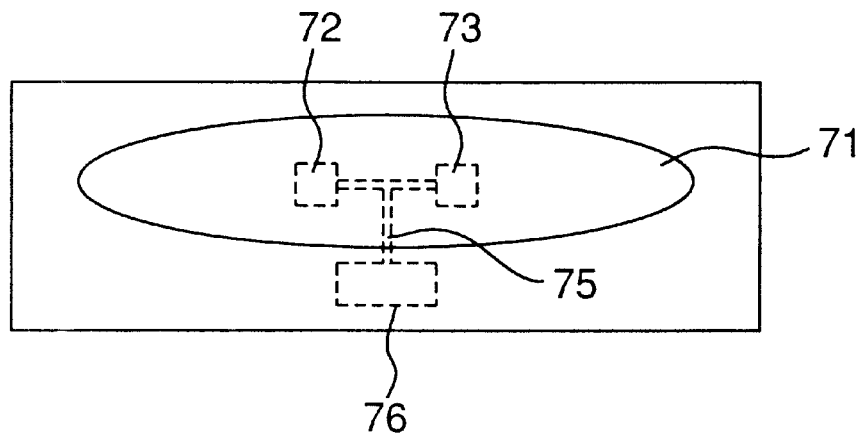
FIG. 21 is a plan view of the radio communication device of the twelfth embodiment.

Moreover, as shown in the plan view of FIG. 21, the dielectric body 71 may have an elliptic shape. In this case, a flat electromagnetic wave beam that has a directivity in a direction deviating at an angle of 90° from the elliptic shape of the dielectric body 71 shown in FIG. 21 can be radiated. Moreover, when the dielectric body 71 has a circular shape, an approximately axially symmetrical radiation pattern is provided.

THIRTEENTH EMBODIMENT

Figure 20:
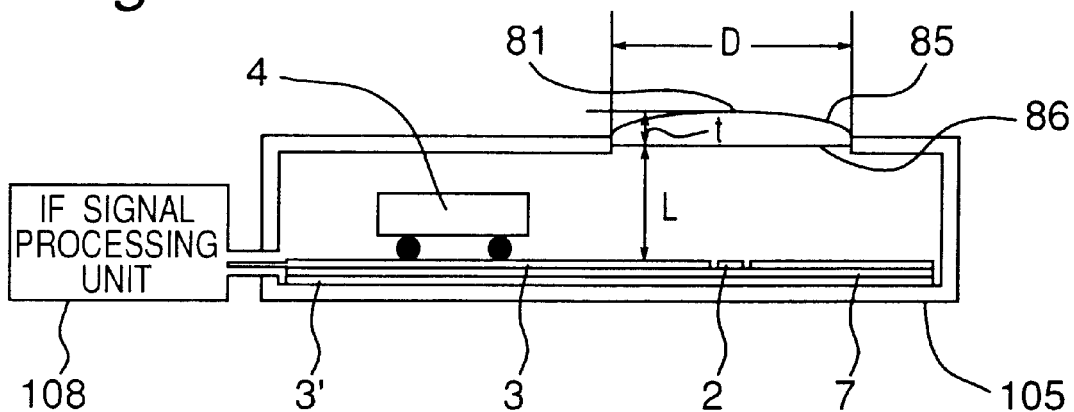
FIG. 20 is a sectional view of a radio communication device according to a thirteenth embodiment of the present invention.

Next, FIG. 20 shows a sectional view of the thirteenth embodiment of the present invention. This thirteenth embodiment corresponds to a modification example of the tenth embodiment of FIG. 10. In this thirteenth embodiment, the electromagnetic waveguide 3 is connected to an IF signal processing unit 108, and this electromagnetic waveguide 3 is connected to the high-frequency unit 4 and the electromagnetic wave radiation structure 2. Moreover, this electromagnetic waveguide 3 is provided close to the surface of the dielectric base 7, and a backing plate 3' is provided closely on the rear surface of this dielectric base 7. An electromagnetic waveguide structure is constructed of this backing plate 3' and the electromagnetic waveguide 3.

Moreover, in this thirteenth embodiment, the electromagnetic waveguide structure, the dielectric base 7 and the high-frequency unit 4 are housed in a conductor package 105, and a dielectric body 81 is set in an opening formed in this conductor package 105. This dielectric body 81 has a convex surface 85 that faces the outside space and a bottom surface 86 that faces the electromagnetic wave radiation structure 2. The distance L between this bottom surface 86 and the electromagnetic wave radiation structure 2 is set similarly to the tenth embodiment. Moreover, the maximum thickness t of the dielectric body 81 is also set similarly to the tenth embodiment. Also, in this thirteenth embodiment, the diameter D of the dielectric body 81 is set similarly to the tenth embodiment. With this arrangement, also in this thirteenth embodiment, the effect of increasing the antenna gain similar to that of the tenth embodiment is obtained. However, in this thirteenth embodiment, the opening of the conductor package 105 and the dielectric body 81 substantially have the same diameter, and therefore, the antenna gain can further be increased.

With regard to the electromagnetic waveguide structure of this thirteenth embodiment, the waveguide structures shown in FIGS. 15A, 15C and 15E can be adopted.

INDUSTRIAL APPLICABILITY

This invention can be applied to a radio communication device for the pseudo-millimetric to millimetric waveband and is useful for the provision of an antenna-integrated type communication device of a high antenna gain, high performance, small size and light weight at low cost.

What is claimed is:

1. An antenna-integrated type radio communication device connected to an intermediate frequency signal processing unit, wherein
a high-frequency unit arranged on a dielectric base on an upper surface of which a multislot antenna made of a conductor, a coplanar transmission line and a power supply line are formed, the high-frequency unit being coupled with the multislot antenna by means of the coplanar transmission line, the communication device being hermetically sealed by a conductor package and the dielectric base, and a conductive sheet having an opening for passage of an electromagnetic wave is attached to a lower surface of the dielectric base.

2. A radio communication device as claimed in claim 1, wherein
a distance between the conductor package and the dielectric base is one-fourth of a wavelength of the electromagnetic wave.

3. A radio communication device as claimed in claim 1, wherein an electromagnetic shield plate is provided on both sides of the multislot antenna located on the dielectric base, and a cut is formed on the electromagnetic shield plate in a portion arranged on the coplanar transmission line.

4. A radio communication device as claimed in claim 1, wherein a lens-shaped dielectric is provided outside the opening for the passage of the electromagnetic wave.

5. A radio communication device as claimed in claim 4, wherein
the dielectric lens is zoned.

6. A radio communication device as claimed in claim 4, wherein a dielectric waveguide section is arranged between the dielectric base and the lens-shaped dielectric.

7. A radio communication device as claimed in claim 1, wherein a dielectric waveguide section is arranged between the dielectric base and the conductor package on an upper surface side of the dielectric base.

8. A radio communication device as claimed in claim 1, wherein a reflecting mirror having a converging effect is arranged between the dielectric base and the conductor package on an upper surface side of the dielectric base.

9. A radio communication device for a pseudo-millimetric or millimetric waveband, wherein
an antenna section of the radio communication device is comprised of an electromagnetic wave radiation structure connected to a transmitter-receiver circuit section or a transmitter circuit section or a receiver circuit section and a dielectric body,
the dielectric body is arranged adjacent to the electromagnetic wave radiation structure and has a structure that is thick in a center region and thin in a peripheral portion, and a thickness of the center region of the dielectric body is approximately $(1/2) \times m$ (m: integer) of an effective wavelength of a desired electromagnetic wave in the dielectric body.

10. A radio communication device as claimed in claim 9, wherein m of approximately $(1/2) \times m$ is not greater than four.

11. A radio communication device as claimed in claim 9, wherein a diameter of the dielectric body at an opening toward a space is set within a range of about one to six times the wavelength of the desired electromagnetic wave in the air.

12. A radio communication device as claimed in claim 9, wherein a plurality of electromagnetic wave radiation structures joined to an electromagnetic waveguide connected to the transmitter-receiver or the transmitter circuit section or the receiver circuit section are arranged on an identical surface, and the diameter of the dielectric body at an opening toward the space is within a range of four to twenty times the wavelength of the desired electromagnetic wave in the air.

13. A radio communication device as claimed in claim 9, wherein a distance between the dielectric body and the electromagnetic wave radiation structure is approximately $(1/2) \times n$ (n: integer) of the wavelength of the desired electromagnetic wave in the air.

14. A radio communication device as claimed in claim 13, wherein n of (1/2)×n of the wavelength is not greater than four.

15. A radio communication device as claimed in claim 9, wherein the electromagnetic wave radiation structure is any one of a slot antenna structure, a multislot antenna structure, a conductor patch structure, a planar spiral antenna structure and a bowtie antenna structure.

16. A radio communication device as claimed in claim 9, wherein the electromagnetic waveguide is any one of a microstrip transmission line, a coplanar type transmission line (CPW), a coplanar type transmission line (GCPW) backed with a conductive sheet, a slot type waveguide, an image waveguide, a nonradiative dielectric line, a coaxial line and a metallic waveguide.

17. A radio communication device for a pseudo-millimetric or millimetric waveband, wherein an antenna section of the radio communication device is comprised of an electromagnetic wave radiation structure connected to a transmitter-receiver circuit section or a transmitter circuit section or a receiver circuit section and a dielectric body, the dielectric body is arranged adjacent to the electromagnetic wave radiation structure and is a parallel-flat-plate-shaped convergence medium that has a high permittivity in a center region and a low permittivity in a peripheral region, and a thickness of the center region of the dielectric body is approximately (1/2)×m (m: integer) of an effective wavelength of a desired electromagnetic wave in the dielectric body.

18. A radio communication device as claimed in claim 17, wherein m of approximately (1/2)×m is not greater than four.

19. A radio communication device as claimed in claim 17, wherein a diameter of the dielectric body at an opening toward a space is set within a range of about one to six times the wavelength of the desired electromagnetic wave in the air.

20. A radio communication device as claimed in claim 17, wherein a plurality of electromagnetic wave radiation structures joined to an electromagnetic waveguide connected to the transmitter-receiver or the transmitter circuit section or the receiver circuit section are arranged on an identical surface, and the diameter of the dielectric body at an opening toward the space is within a range of four to twenty times the wavelength of the desired electromagnetic wave in the air.

21. A radio communication device as claimed in claim 17, wherein a distance between the dielectric body and the electromagnetic wave radiation structure is approximately (1/2)×n (n: integer) of the wavelength of the desired electromagnetic wave in the air.

22. A radio communication device as claimed in claim 21, wherein n of (1/2)×n of the wavelength is not greater than four.

23. A radio communication device as claimed in claim 17, wherein the electromagnetic wave radiation structure is any one of a slot antenna structure, a multislot antenna structure, a conductor patch structure, a planar spiral antenna structure and a bowtie antenna structure.

24. A radio communication device as claimed in claim 17, wherein the electromagnetic waveguide is any one of a microstrip transmission line, a coplanar type transmission line (CPW), a coplanar type transmission line (GCPW) backed with a conductive sheet, a slot type waveguide, an image waveguide, a nonradiative dielectric line, a coaxial line and a metallic waveguide.

* * * * *

UNITED STATES PATENT AND TRADEMARK OFFICE
CERTIFICATE OF CORRECTION

PATENT NO. : 6,518,932 B1
DATED : February 11, 2003
INVENTOR(S) : Matsui, Toshiaki et al.

It is certified that error appears in the above-identified patent and that said Letters Patent is hereby corrected as shown below:

Title page,
Item [73], Assignee, please change the name of the first assignee from
"Communications Research Laboratory, Independent Administrative Institute" to
-- Communications Research Laboratory, Independent Administrative Institution --; and please add the name of the second Assignee
-- Matsui, Toshiaki --.

Signed and Sealed this

Twenty-sixth Day of October, 2004

JON W. DUDAS
*Director of the United States Patent and Trademark Office*